United States Patent
Edelstein et al.

(10) Patent No.: US 9,659,817 B1
(45) Date of Patent: May 23, 2017

(54) STRUCTURE AND PROCESS FOR W CONTACTS

(71) Applicant: International Business Machines Corporation, Armonk, NY (US)

(72) Inventors: Daniel C. Edelstein, White Plains, NY (US); Baozhen Li, South Burlington, VT (US); Chih-Chao Yang, Glenmont, NY (US)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 0 days.

(21) Appl. No.: 15/134,959

(22) Filed: Apr. 21, 2016

Related U.S. Application Data

(63) Continuation of application No. 14/945,754, filed on Nov. 19, 2015, now Pat. No. 9,406,617.

(51) Int. Cl.
H01L 21/76 (2006.01)
H01L 21/768 (2006.01)
H01L 21/321 (2006.01)
H01L 23/535 (2006.01)

(52) U.S. Cl.
CPC ...... H01L 21/76879 (2013.01); H01L 21/321 (2013.01); H01L 21/76843 (2013.01); H01L 23/535 (2013.01)

(58) Field of Classification Search
None
See application file for complete search history.

(56) References Cited

U.S. PATENT DOCUMENTS 9,406,617 B1 * 8/2016 Edelstein ............ H01L 23/535

OTHER PUBLICATIONS

Daniel C. Edelstein, et al., "Structure and Process for W Contacts", U.S. Appl. No. 14/945,754, filed Nov. 19, 2015.
Daniel C. Edelstein, et al., "Structure and Process for W Contacts", U.S. Appl. No. 15/134,975, filed Apr. 21, 2016.
List of IBM Patents or Patent Applications Treated As Related; (Appendix P), Date Filed Apr. 25, 2016; 2 pages.

* cited by examiner

*Primary Examiner* — Michael Lebentritt
(74) *Attorney, Agent, or Firm* — Cantor Colburn LLP; Steven Meyers

(57) ABSTRACT

Structures and processes include a single metallization step for forming a metal nitride liner layer suitable for contact formation. The structure and processes generally includes forming a nitrogen-enriched surface in a deposited metal liner layer or forming a nitrogen-enriched surface in the dielectric material prior to deposition of the metal liner layer. In this manner, nitridization of the metal occurs upon deposition of nitrogen ions into the metal liner layer and/or as a function of additional conventional processing in fabricating the integrated circuit such that the deposited nitrogen ions diffuse into at least a portion of the metal liner layer. As a consequence, only a single metal layer deposition step is needed to form the metal liner layer.

8 Claims, 2 Drawing Sheets

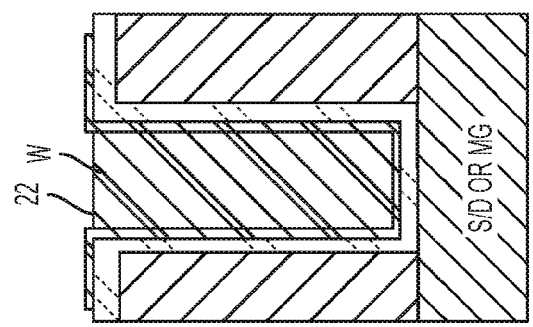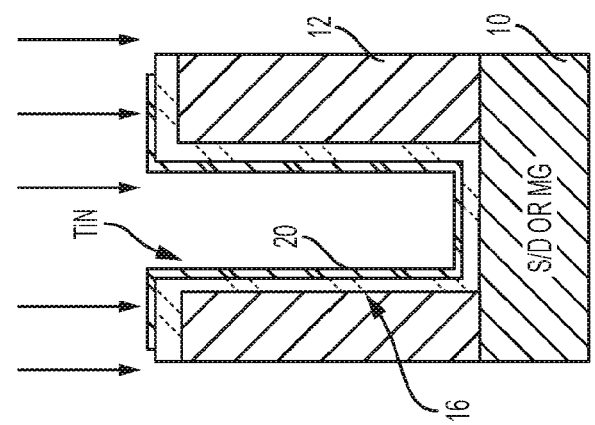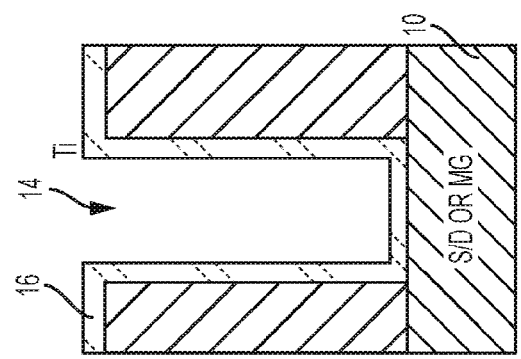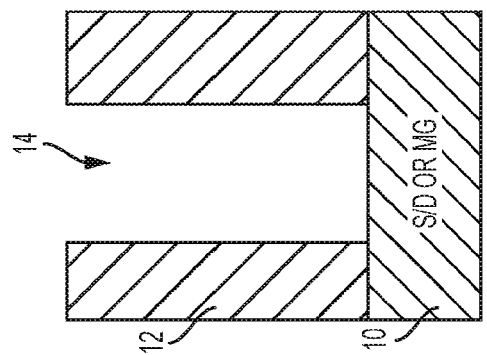

STRUCTURE AND PROCESS FOR W CONTACTS

DOMESTIC PRIORITY

This application is a CONTINUATION of U.S. patent application Ser. No. 14/945,754, filed Nov. 19, 2015, the disclosure of which is incorporated by reference herein in its entirety.

BACKGROUND

The present invention generally relates to semiconductor integrated circuits, and more particularly, to the structure and formation of liner structures that create insulation and diffusion barriers of a tungsten metal contact.

An integrated circuit (IC) generally includes a semiconductor substrate in which a number of device regions are formed by diffusion or ion implantation of suitable dopants. This substrate usually involves a passivating and an insulating layer required to form different device regions. The total thickness of these layers is usually less than one micron. Openings through these layers (called vias or contact holes) allow electrical contact to be made selectively to the underlying device regions. A conducting material is used to fill these holes, which then make contact to semiconductor devices.

SUMMARY

The present invention is generally directed to methods for forming an integrated circuit and contact structures for an integrated circuit.

In one embodiment, a method for forming an integrated circuit comprises providing a patterned substrate comprising a contact hole in a dielectric layer, wherein the contact hole includes sidewalls formed of the dielectric layer and a bottom surface defined by a source or drain region or a metal gate; conformally depositing a single metal liner layer onto the patterned substrate; generating nitrogen ions from a nitrogen containing gas selected from the group consisting of nitrogen ($N_2$) and ammonia ($NH_3$); exposing the metal liner layer to form a nitrogen enriched metal liner layer; and depositing a tungsten metal into the contact hole.

In another embodiment, method for forming an integrated circuit comprises providing a patterned substrate comprising a contact hole in a dielectric layer, wherein the contact hole includes sidewalls formed of the dielectric layer and a bottom surface defined by a source/drain region or a metal gate; generating nitrogen ions from a nitrogen containing gas selected from the group consisting of nitrogen ($N_2$) and ammonia ($NH_3$); exposing the substrate including the dielectric layer to form a nitrogen enriched dielectric layer at about a surface of the dielectric layer; conformally depositing a single metal liner layer onto the patterned substrate and forming a metal nitride at an interface between the single metal liner layer and the nitrogen enriched dielectric layer and into at least a portion of the metal liner layer; and depositing a tungsten metal into the contact hole.

A contact structure for an integrated circuit device comprises a patterned dielectric material comprising at least one contact hole, the contact hole including a bottom surface, and sidewalls extending from the bottom surface to a top surface, wherein the bottom surface is defined by a source/drain region or a metal gate; a self-formed metal nitride liner layer on the sidewalls and the bottom surface of the at least one contact hole; and a tungsten plug disposed within the at least one contact hole.

In another embodiment, the contact structure for an integrated circuit device comprises a patterned dielectric material comprising at least one contact hole, the contact hole including a bottom surface, and sidewalls extending from the bottom surface to a top surface, wherein the bottom surface is defined by a source/drain region or a metal gate, and wherein the dielectric material is enriched at least at the sidewalls of the contact hole; a metal liner layer disposed on the sidewalls and the bottom surface of the at least one contact hole, wherein contact of the metal liner layer with the enriched dielectric material forms a metal nitride gradient in the metal liner layer; and a tungsten plug disposed within the at least one contact hole.

Additional features and advantages are realized through the techniques of the present invention. Other embodiments and aspects of the invention are described in detail herein and are considered a part of the claimed invention. For a better understanding of the invention with advantages and features, refer to the description and to the drawings.

BRIEF DESCRIPTION OF THE DRAWINGS

The subject matter that is regarded as the invention is particularly pointed out and distinctly claimed in the claims at the conclusion of the specification. The foregoing and other objects, features, and advantages of the invention are apparent from the following detailed description taken in conjunction with the accompanying drawings in which:

FIG. 1A depicts a schematic cross-sectional view illustrating a contact hole formed in an interlevel dielectric layer according to an embodiment of the present invention;

FIG. 1B depicts a schematic cross-sectional view illustrating the structure of FIG. 1A after formation of a titanium metal liner layer;

FIG. 1C depicts a schematic cross-sectional view illustrating the structure of FIG. 1B after deposition of nitrogen ions onto the titanium metal liner layer;

FIG. 1D depicts a schematic cross-sectional view illustrating the structure of FIG. 1C subsequent to formation of a tungsten plug within the contact hole;

Figure 2A:
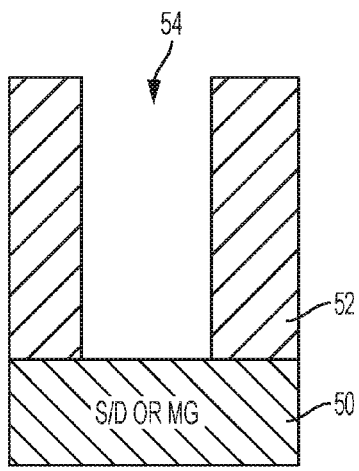
FIG. 2A depicts a schematic cross-sectional view illustrating a contact hole formed in an interlevel dielectric layer according to an embodiment of the present invention.

The detailed description explains the preferred embodiments of the invention, together with advantages and features, by way of example with reference to the drawings.

DETAILED DESCRIPTION

In its simplest form, a via may be formed by first masking an insulating layer, e.g., a dielectric layer, with photoresist and then selectively etching a portion of the insulating layer. The via is etched through an opening formed in the photoresist using well known photolithographic techniques, to form an opening to the underlying conductive layer. Depending on the aspect ratio and the interconnection ground rules, isotropic or anisotropic etching processes may be used to form a hole in the dielectric.

After the via etch, and photoresist removal, it is possible to deposit a conductive layer in the via. Conductive material is deposited in the via to form the electrical interconnect between the conducting layers. However, a liner layer is usually desirable between the insulating and conductive layers.

The presence of a liner layer on the sidewalls of the via is desirable because structural delamination and conductor metal diffusion can occur unless there is a layer of protection, a liner layer, between the conductive layer and the etched insulating layer. For structural integrity, the liner layer should line the entire side wall and will generally cover the bottom of the via as well.

The liner and conductive layers may be deposited by sputtering, CVD, electroless deposition and electrodeposition. Rf bias sputtering, in general, is known in the art and involves the reemission of material during the sputter deposition thereof through the effects of attendant ion bombardment of the layer being deposited. In effect, Rf biased sputtering is the positive ion bombardment of a substrate or film during its deposition. Therefore, during Rf bias sputtering, there is always simultaneous etching and deposition of the material being deposited. Previously deposited layers are not etched as part of a standard Rf biased sputter deposition.

High quality contacts are essential to high device yield and reliability, but fabrication of these high quality contacts poses several technical challenges. For example, the contacts are designed to have a high ratio of the height to the diameter, known as the aspect ratio. High aspect ratio is a consequence of several constraints in the design of the IC.

For example, it is desirable to achieve a high packing density of the contacts to enable high circuit density. This constrains the diameter of the contacts to be as small as possible. In addition, the dielectric separating the semiconductor devices from the first metal level must be thick enough to protect transistors. The contacts often span the thickness of dielectric over a transistor and transistor gate over the substrate. These constraints lead to contacts with aspect ratios large enough to present manufacturing challenges.

As integrated circuit technology become smaller, the large aspect ratio combined with very small geometries creates many manufacturing and performance issues. Current attempts to manufacture very small contacts have been plagued with very high resistance. These contact resistances can dominate integrated circuit performance particularly with small process geometries such as thirty-two nanometers.

The dielectrics used for the insulating layers are typically comprised of silicon dioxide, a thermosetting polyarylene resin, an organosilicate glass such as a carbon-doped oxide (SiCOH), or any other type of hybrid related dielectric.

The liner can be a single layer or multiple layers and is not located on the bottom horizontal surface of the via. The liner is comprised of a metal such as, for example, Ta, Ti, Ru, Ir, Co, and W, and/or a metal nitride such as TaN, TiN, and WN. An optional adhesion layer, not specifically shown, can be used to enhance the bonding of the liner to the dielectric layer.

Current processes for depositing the liner generally include a two-step process, which includes a first step of depositing a metal followed by a second step of depositing a metal nitride layer. The two step process for depositing two metal layers is inherently inefficient since it is a two-step process and affects throughput. Moreover, because two layers are deposited, thickness control becomes an issue especially as device dimensions shrink. For example, for 32 nm node device fabrication, the thickness of each layer defining the liner layer is on the order of about 20 Angstroms (Å) for a total thickness of about 40 Å. Smaller thicknesses will be required for future device fabrication, which will be difficult given the relatively high deposition rates utilized to produce individual layer thicknesses at or less than 20 Å.

The present invention provides a structure and process including a single metallization step for forming a metal liner layer suitable for contact formation. The structures and processes generally include forming a nitrogen-enriched surface in a deposited metal liner layer or forming a nitrogen-enriched surface in the dielectric material prior to deposition of the metal liner layer. In this manner, nitridization of the metal occurs upon treatment of nitrogen ions into the metal liner layer and/or as a function of additional conventional processing in fabricating the integrated circuit such that the treated nitrogen ions diffuse into at least a portion of the metal liner layer. As a consequence, only a single metal layer deposition step is needed to form the metal liner layer as opposed to the prior art's use of two metal deposition steps. Moreover, improved thickness control is realized since only one metal layer is deposited, which is especially advantageous as the art transitions to smaller device dimensions.

For ease in understanding and for example only, reference herein will be made to a titanium metal and nitridization thereof so as to form a titanium nitride liner layer. However, it should be apparent that other metals are suitable including, but not limited to, tantalum (Ta), titanium (Ti), ruthenium (Ru), iridium (Ir) tungsten (W), cobalt (Co) mixtures thereof, and the like. The metal liner layer serves as a barrier to prevent conductive material from diffusing through and can be formed by a deposition process such as, for example, atomic layer deposition (ALD), chemical vapor deposition (CVD), plasma enhanced chemical vapor deposition (PECVD), sputtering, chemical solution deposition, or plating. The thickness of the metal liner layer may vary depending on the exact means of the deposition process as well as the material employed.

In one embodiment, the process generally includes depositing a titanium metal liner layer at a thickness of less than 40 Angstroms followed by surface treatment of the titanium metal liner layer with a nitrogen containing gas to form a nitrogen enriched titanium metal surface. Nitrogen enrichment of the titanium metal forms titanium nitride Ti(N). As defined herein, the nitrogen-containing gas is selected from the group consisting of nitrogen ($N_2$) and ammonia ($NH_3$). Upon exposure to a suitable energy source, the nitrogen or ammonia dissociates to form nitrogen ions, which are then utilized to enrich a contact surface. Suitable energy sources include but are not limited to thermal energy sources and plasma energy sources.

Plasma nitridization generally includes exposing the nitrogen-containing to a plasma effective to generate nitrogen ions. The substrate including the titanium metal liner layer or the dielectric layer are then exposed to the nitrogen ions to form a nitrogen enrich surface that also penetrates the respective surface to form a nitrogen enriched gradient in the titanium metal liner layer. Subsequent fabrication of the device facilitates additional nitrogen diffusion within the titanium metal liner layer or from the dielectric surface to the titanium metal liner layer to form a titanium nitride (TiN) liner layer. The process temperature is between 80 to 400° C., and the bias is between 100 to 900 W.

Thermal nitridization provides a similar effect as plasma nitridization but generally includes exposing the substrate to a temperature effective to generate nitrogen ions from the nitrogen containing gas. Again, the nitrogen ions contact and penetrate the surface of the titanium metal liner layer or the dielectric layer so as to form a nitrogen enriched gradient in the titanium metal liner layer or dielectric layer. Subsequent conventional fabrication of the device facilitates further diffusion within the titanium metal liner layer or from the dielectric layer to the titanium metal liner layer so as to form a titanium nitride liner layer. The process temperature is between 200 to 400° C.

Referring now to FIG. 1A-1D, there is shown a process and resulting structure for forming a titanium nitride liner layer for a tungsten contact structure in accordance with an embodiment. As shown in FIG. 1A, the process generally includes first forming contact holes 14 in an interlevel dielectric layer (ILD) 12 deposited on a substrate 10 through conventional lithography and etching processes. The lithographic step includes applying a photoresist to the surface of the dielectric layer, exposing the photoresist to a desired pattern of radiation, and developing the exposed resist utilizing a conventional resist developer to form a pattern. The etching process may be a dry etching or wet etching process.

The term "wet etching" generally refers to application of a chemical solution. This is preferably a time controlled dip in the etch solution. Preferred etch solutions include $HNO_3$, HCL, $H_2SO_4$, HF or combinations thereof.

The term "dry etching" is used here to denote an etching technique such as reactive-ion-etching (RIE), ion beam etching, plasma etching or laser ablation. During the etching process, the pattern is first transferred to the dielectric layer. The patterned photoresist is typically, but not necessarily, removed from the structure after the pattern has been transferred into the dielectric film. The patterned feature formed into the dielectric material includes the contact holes.

The dielectric layer 12 may comprise any dielectric including inorganic dielectrics or organic dielectrics. The dielectric material 12 may be porous or non-porous. Some examples of suitable dielectrics that can be used as the dielectric material include, but are not limited to: $SiO_2$, silsesquioxanes, carbon doped oxides (i.e., organosilicates) that include atoms of Si, C, O and H, thermosetting polyarylene ethers, or multilayers thereof. The term "polyarylene" is used to denote aryl moieties or inertly substituted aryl moieties which are linked together by bonds, fused rings, or inert linking groups such as, for example, oxygen, sulfur, sulfone, sulfoxide, carbonyl and the like. The ILD may be deposited by PECVD procedures as is generally known in the art. These patterned features correspond to the subsequent interconnect vias (i.e., metal plugs between levels) and can be aligned with underlying source and/or drain regions or over a metal gate structure defined by the particular substrate 10.

Referring to FIG. 1B, after removal of the photoresist used to create the contact holes 14 via plasma ashing and wet cleaning, a titanium metal liner layer 16 is conformally deposited onto the substrate including the exposed dielectric surfaces defining the contact hole and the underlying exposed source/drain or metal gate regions. The titanium metal liner layer may be deposited through conventional deposition processes such as, for example, a plasma vapor deposition process such as R.F. sputtering. The thickness of the deposited titanium metal liner layer is between 10 Å and 40 Å. The titanium metal liner layer is used to provide adhesion between subsequent overlying structures, such as a tungsten plug structure, and ILD layer 12, as well as supplying the needed titanium, for subsequent formation of a titanium silicide layer, if desired.

In FIG. 1C, the patterned substrate with the titanium metal liner layer 16 is exposed to nitrogen ions generated from the nitrogen containing gas 18 to form a nitrogen enriched titanium metal liner layer 20. As described above, generation of the nitrogen ions can be plasma or thermally generated, wherein the nitrogen ions penetrate into at least a portion of the titanium metal liner layer. In one embodiment, the nitrogen ions penetrate into the titanium metal liner layer 16 at a depth of about 75 percent of the thickness of the titanium metal liner layer; in other embodiments, the nitrogen ions penetrate into the titanium metal liner layer 16 at a depth of about 50 percent of the thickness of the titanium metal liner layer; and in still other embodiments, the nitrogen ions penetrate into the titanium metal liner layer 16 at a depth of about 25 percent of the thickness of the titanium metal liner layer.

The nitrogen enriched titanium metal liner layer forms titanium nitride (Ti(N)) 20 in the areas where the nitrogen ions have penetrated, which generally includes coating the sides of contact hole 14 and the source/drain regions or metal gate structure defined by the underlying substrate 10, exposed at the bottom of the contact hole. Moreover, subsequent processing such as a rapid thermal anneal step to create a metal silicide layer or the like can further effect diffusion of the nitrogen ions within the titanium metal liner layer to form a substantially uniform titanium nitride layer.

Turning to FIG. 1D, a conductive metal such as tungsten is then deposited onto substrate including the contact hole to form the so-called tungsten plug 22. By way of example, a conformal LPCVD procedure at a temperature between about 400 to 500° C. can be used to deposit the tungsten layer to a thickness between about 2000 Å to 9000 Å. The reactants, as well as the by-products, of the tungsten deposition, performed using silane and tungsten hexafluoride, cannot attack underlying materials, which is protected by the titanium nitride layer.

A chemical mechanical polishing (CMP) procedure is next used to remove the regions of tungsten, and the regions of titanium nitride layer 20 residing on the top surface of ILD 12. In addition to removal of the unwanted regions of material, via a CMP procedure, the removal procedure can also be accomplished via a blanket reactive ion etch (RIE) procedure (without the use of photolithographic procedures) using a suitable etchant.

In another embodiment shown in FIGS. 2A-D, a patterned dielectric layer is exposed to nitrogen ions generated from the nitrogen containing gas to form a nitrogen enriched dielectric layer. A titanium metal liner layer is then deposited onto the nitrogen enriched dielectric layer, wherein the nitrogen ions diffuse into the titanium metal liner layer to form titanium nitride.

Turning to FIG. 2A, the process generally includes first forming contact holes 54 in an interlevel dielectric layer (ILD) 52 deposited on a substrate 50 through conventional lithography and etching processes. As previously disclosed, the dielectric layer 54 may comprise any dielectric including inorganic dielectrics or organic dielectrics and may be porous or non-porous. Some examples of suitable dielectrics that can be used as the dielectric material include, but are not limited to: SiO$_2$, silsesquioxanes, carbon doped oxides (i.e., organosilicates) that include atoms of Si, C, O and H, thermosetting polyarylene ethers, or multilayers thereof. These patterned features, i.e., contact holes 54, correspond to the subsequent interconnect vias (i.e., metal plugs between levels) and can be aligned with underlying source and/or drain regions or over a metal gate structure defined by the particular substrate 50.

Figure 2B:
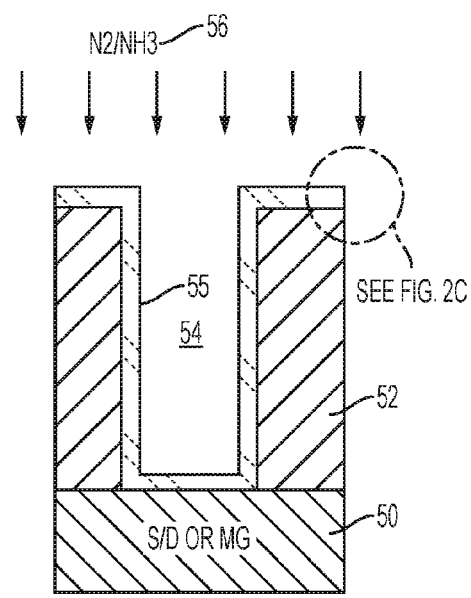
FIG. 2B depicts a schematic cross-sectional view illustrating the structure of FIG. 2A after deposition of nitrogen ions onto the dielectric layer to form a nitrogen enriched dielectric layer.
Figure 2C:
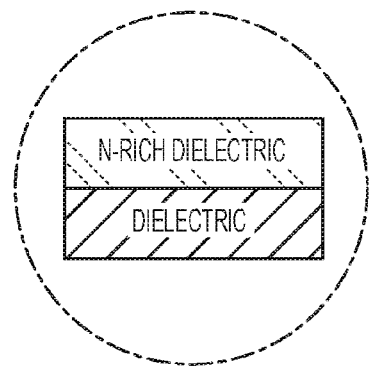
FIG. 2C depicts a enlarged cross-sectional view illustrating the structure of FIG. 2B after deposition of a titanium metal line layer on all of the exposed surfaces including the bottom surface of the contact hole.

Referring to FIG. 2B, after removal of the photoresist used to create the contact holes 54 via plasma ashing and wet cleaning, the dielectric layer 52 and the exposed source/drain regions or metal gate are exposed to nitrogen ions generated from the nitrogen containing gas 56 to form a nitrogen enriched dielectric layer 55. The nitrogen enriched dielectric 55 can serve to provide a protection layer to the underlying bulk dielectric material 52 so as to prevent dielectric damage and minimize surface roughness from additional processing. As described above, generation of the nitrogen ions can be plasma or thermally generated, wherein the nitrogen ions penetrate into at least a portion of the dielectric layer 52, i.e., on the order of a few Angstroms. FIG. 2C provides and enlarged sectional view of the nitrogen enriched dielectric layer and the bulk dielectric. It should be apparent that the nitrogen enrichment may form a gradient.

Figure 2D:
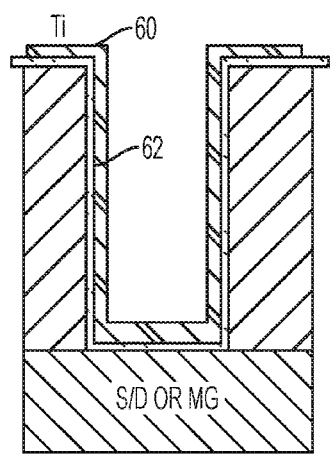
FIG. 2D depicts a schematic cross-sectional view illustrating the structure of FIG. 2B after deposition of a titanium metal line layer on all of the exposed surfaces including the bottom surface of the contact hole.

In FIG. 2D, a titanium metal liner layer 60 is then conformally deposited onto the patterned substrate including the exposed nitrogen enriched dielectric surfaces defining the contact and the source/drain or metal gate regions. The titanium metal liner layer may be deposited through conventional deposition processes such as, for example, a plasma vapor deposition process such as Rf sputtering. The thickness of the deposited titanium metal liner layer is between 10 Å and 40 Å. A titanium nitride layer 62 forms at about an interface of the titanium metal liner layer 60 and the nitrogen enriched dielectric layer 55.

Figure 2E:
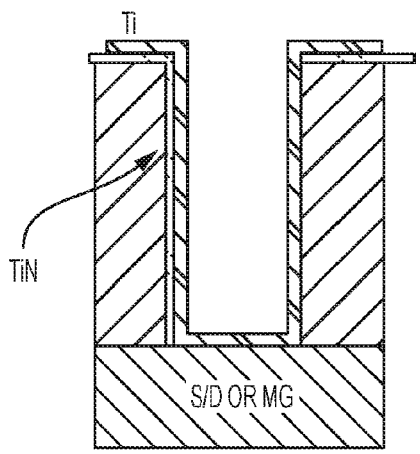
FIG. 2E depicts a schematic cross-sectional view illustrating the structure of FIG. 2B after deposition of a titanium metal line layer on all of the exposed surfaces with the exception of the bottom surface of the contact hole.

In some embodiments, it may be desirable to have the titanium metal layer directly contact the underlying metal gate structure as shown in FIG. 2E. For example, after the step shown in FIG. 2B, a H$_2$-contained chemical treatment is applied to selectively remove the nitrogen enriched layer from the bottom surface of the contact feature (S/D or MG surface), while keeping the nitrogen enriched layer at sidewalls of the contact feature.

A conductive metal such as tungsten is then deposited into the contact hole to form the so-called tungsten plug (not shown, but similar to that shown in FIG. 1D using a conventional deposition process including, but not limited to: CVD, PECVD, sputtering, chemical solution deposition or plating). By way of example, a conformal LPCVD procedure at a temperature between about 400 to 500° C. can be used to deposit the tungsten layer to a thickness between about 2000 Å to 9000 Å. The reactants, as well as the by-products, of the tungsten deposition, performed using silane and tungsten hexafluoride, cannot attack underlying materials, now protected by titanium nitride layer. Although tungsten is preferred, other suitable conductive materials include, for example, Cu, Al, and combinations thereof. The conductive material is filled into the contact hole.

A chemical mechanical polishing (CMP) procedure is next used to remove the regions of tungsten, and the regions of titanium nitride layer residing on the top surface of ILD 12 such that the upper surface of the tungsten plug that is substantially coplanar with the upper surface of the dielectric material. In addition to removal of the unwanted regions of material, via a CMP procedure, the removal procedure can also be accomplished via a blanket RIE procedure (without the use of photolithographic procedures) using a suitable etchant All ranges disclosed herein are inclusive of the endpoints, and the endpoints are combinable with each other.

All cited patents, patent applications, and other references are incorporated herein by reference in their entirety.

The use of the terms "a" and "an" and "the" and similar referents in the context of describing the invention (especially in the context of the following claims) are to be construed to cover both the singular and the plural, unless otherwise indicated herein or clearly contradicted by context. Further, it should further be noted that the terms "first," "second," and the like herein do not denote any order, quantity, or importance, but rather are used to distinguish one element from another.

While the preferred embodiment to the invention has been described, it will be understood that those skilled in the art, both now and in the future, may make various improvements and enhancements which fall within the scope of the claims which follow. These claims should be construed to maintain the proper protection for the invention first described.

The invention claimed is:

1. A method for forming an integrated circuit comprising:
   providing a patterned substrate comprising a contact hole in a dielectric layer, wherein the contact hole includes sidewalls formed of the dielectric layer and a bottom surface defined by a source/drain region or a metal gate;
   generating nitrogen ions from a nitrogen containing gas selected from the group consisting of nitrogen (N$_2$) and ammonia (NH$_3$);
   exposing the substrate including the dielectric layer to form a nitrogen enriched dielectric layer at about a surface of the dielectric layer;
   conformally depositing a single metal liner layer onto the patterned substrate and forming a metal nitride at an interface between the single metal liner layer and the nitrogen enriched dielectric layer and into at least a portion of the metal liner layer;
   depositing a tungsten metal into the contact hole, wherein the tungsten metal is in direct contact with the nitrogen enriched metal liner layer; and
   removing regions of the tungsten metal and regions of the metal nitride on a top surface of the dielectric layer such that the tungsten metal is coplanar to the top surface of the dielectric layer.

2. The method of claim 1, wherein generating the nitrogen ions from the nitrogen containing gas comprises exposing the energy source effective to generate the nitrogen ions from the nitrogen containing gas.

3. The method of claim 1, wherein the energy source is a plasma energy source.

4. The method of claim 1, wherein the energy source is thermal energy source.

5. The method of claim 1, wherein the metal liner layer is formed of a metal selected from the group consisting of tantalum (Ta), titanium (Ti), ruthenium (Ru), iridium (Ir) tungsten (W), Co (cobalt) and mixtures thereof.

6. The method of claim 1, further comprising selectively removing the nitrogen from a bottom surface of the contact hole prior to depositing the single metal liner layer, wherein the single metal liner layer is in direct contact with the bottom surface of the contact hole such that the metal liner layer contacts the source/drain regions or the metal gate and is free of nitrogen enrichment.

7. The method of claim 1, wherein removing regions of the tungsten metal and regions of the metal nitride on a top surface of the dielectric layer comprises a chemical mechanical polishing process.

8. The method of claim 1, wherein removing regions of the tungsten metal and regions of the metal nitride on a top surface of the dielectric layer comprises a blanket reactive ion etch process.

\* \* \* \* \*